(12) United States Patent
Kim et al.

(10) Patent No.: US 10,665,722 B2
(45) Date of Patent: May 26, 2020

(54) ARRAY SUBSTRATE AND LIQUID CRYSTAL DISPLAY DEVICE INCLUDING THE SAME

(71) Applicant: LG Display Co., Ltd., Seoul (KR)

(72) Inventors: Do-Yeon Kim, Busan (KR);
Jong-Hyun Kim, Jeju-si (KR);
Sung-Wook Choi, Yeosu-si (KR)

(73) Assignee: LG Display Co., Ltd., Seoul (KR)

( * ) Notice: Subject to any disclaimer, the term of this patent is extended or adjusted under 35 U.S.C. 154(b) by 108 days.

(21) Appl. No.: 15/826,420

(22) Filed: Nov. 29, 2017

(65) Prior Publication Data
US 2018/0151747 A1   May 31, 2018

(30) Foreign Application Priority Data

Nov. 30, 2016  (KR) .................. 10-2016-0162196

(51) Int. Cl.
*H01L 29/786*  (2006.01)
*G02F 1/1362*  (2006.01)
*G02F 1/1343*  (2006.01)
*G02F 1/136*   (2006.01)

(52) U.S. Cl.
CPC ........ *H01L 29/78606* (2013.01); *G02F 1/136* (2013.01); *G02F 1/1362* (2013.01); *G02F 1/134363* (2013.01); *G02F 2001/13606* (2013.01); *G02F 2001/134372* (2013.01)

(58) Field of Classification Search
CPC ......... H01L 29/78606; G02F 1/134363; G02F 1/136
USPC .......................................................... 349/43
See application file for complete search history.

(56) References Cited

U.S. PATENT DOCUMENTS

| 5,270,559 | A  | * | 12/1993 | Yariv ............... H01L 29/42396 |
|           |    |   |         | 257/249 |
| 8,674,365 | B2 |   | 3/2014  | Ku et al. |
| 8,698,154 | B2 |   | 4/2014  | Jang et al. |
| 8,759,165 | B2 |   | 6/2014  | Ku et al. |
| 9,618,817 | B2 |   | 4/2017  | Jang et al. |
| 2009/0268145 | A1 | | 10/2009 | Anjo et al. |

(Continued)

FOREIGN PATENT DOCUMENTS

| CN | 103163702 A | 6/2013 |
| CN | 103365011 A | 10/2013 |

(Continued)

OTHER PUBLICATIONS

Japan Patent Office, Notification of Reasons for Refusal, JP Patent Application No. 2017-228747, dated Oct. 30, 2018, seven pages.

(Continued)

*Primary Examiner* — Lucy P Chien
(74) *Attorney, Agent, or Firm* — Fenwick & West LLP

(57) ABSTRACT

An array substrate includes a first substrate, a thin film transistor disposed on the first substrate, a first electrode located on the first substrate, a protective layer located on the first electrode, and a second electrode located on the protective layer, wherein the protective layer includes a first layer and a second layer, the first layer has a first resistance value, the second layer has a second resistance value, the first layer is located between the first electrode and the second layer, and the second resistance value is less than the first resistance value.

21 Claims, 9 Drawing Sheets

(56) References Cited

U.S. PATENT DOCUMENTS

| | | |
|---|---|---|
| 2012/0099059 A1 | 4/2012 | Kim et al. |
| 2012/0113372 A1* | 5/2012 | Kato ................. G02F 1/133345 |
| | | 349/138 |
| 2013/0148072 A1 | 6/2013 | Jang et al. |
| 2013/0161625 A1 | 6/2013 | Ku et al. |
| 2013/0256669 A1 | 10/2013 | Jang et al. |
| 2014/0127844 A1 | 5/2014 | Ku et al. |

FOREIGN PATENT DOCUMENTS

| | | |
|---|---|---|
| JP | 2011-059157 A | 3/2011 |
| TW | I226502 B | 1/2005 |
| TW | 200933275 A | 8/2009 |
| TW | 201327836 A | 7/2013 |

OTHER PUBLICATIONS

Taiwan Patent Office, Office Action, TW Patent Application No. 106141444, dated Nov. 28, 2018, seven pages.
Taiwan Intellectual Property Office, Second Office Action, TW Patent Application No. 106141444, dated Apr. 1, 2019, nine pages.

* cited by examiner

ARRAY SUBSTRATE AND LIQUID CRYSTAL DISPLAY DEVICE INCLUDING THE SAME

CROSS-REFERENCE TO RELATED APPLICATIONS

This application claims the benefit under 35 U.S.C. 119(a) of Republic of Korea Patent Application No. 10-2016-0162196, filed on Nov. 30, 2016, in the Republic of Korea Intellectual Property Office, which is incorporated herein by reference in its entirety.

BACKGROUND

1. Technical Field

The present disclosure relates to an array substrate for a liquid crystal display device and a liquid crystal display device including the same, and more particularly, to an array substrate capable of effectively reducing an afterimage and a liquid crystal display device including the same.

2. Discussion of the Related Art

Generally, liquid crystal display devices are driven by utilizing optical anisotropy and polarization properties of liquid crystals. Since a liquid crystal has a thin and long structure, an array of molecules has an orientation, and can control an orientation of molecular arrangement by artificially applying an electric field to liquid crystals.

Accordingly, when the orientation of the molecular arrangement of the liquid crystals is arbitrarily adjusted, the molecular arrangement of the liquid crystals is changed, light is refracted in the orientation of the molecular arrangement of the liquid crystals due to the optical anisotropy, and thus image information can be displayed.

Nowadays, an active-matrix liquid crystal display device (AM-LCD, hereinafter, abbreviated to a liquid crystal display device) in which thin film transistors and pixel electrodes connected to the thin film transistors are arrayed in a matrix pattern has attracted the most attention because of having superior resolution and video display ability.

The liquid crystal display device includes a color filter substrate on which common electrodes are formed, an array substrate on which pixel electrodes are formed, and liquid crystals interposed between the two substrates, and since the common electrodes and the pixel electrodes drive the liquid crystals using an electric field perpendicularly applied thereto, the liquid crystal display device is superior in characteristics such as transmissivity and aperture ratio.

In addition, a lateral electric field type liquid crystal display device in which electrodes are alternately disposed on one substrate of upper and lower substrates, liquid crystals are disposed between the substrates, and an image is displayed and a fringe-field switching (FFS) mode liquid crystal display device in which a characteristic of a viewing angle is superior to that of the lateral electric field type liquid crystal display device have been recently proposed.

FIG. 1 is a schematic view illustrating a conventional FFS mode liquid crystal display device.

As illustrated in the drawing, a FFS mode liquid crystal display device 100 includes gate lines 43 and data lines 51 which intersect with the gate lines 43 and define a pixel area P.

In addition, a thin film transistor Tr which is a switching element connected to the data line 51 and the gate line 43 and includes a gate electrode (not shown), a gate insulating film (not shown), a semiconductor layer (not shown), and source and drain electrodes 55 and 58 is formed in the pixel area P.

In addition, a pixel electrode 60 having a plate shape is formed in the pixel area P.

In addition, a common electrode 70 which corresponds to the pixel area P, overlaps the pixel electrode 60 having the plate shape, and has a plurality of openings op each having a bar shape formed in the pixel area P is formed on an entire surface of the display area including the pixel area P. Here, the common electrode 70 is formed on the entire surface of the display area, and a portion corresponding to one pixel area P is illustrated using one alternate long and short dash line.

The FFS mode liquid crystal display device 100 having the above configuration generates a fringe field by applying a voltage between the common electrode 70 including the plurality of openings op having the bar shape and the pixel electrode 60 which are formed in each pixel area P.

That is, when an electric field is generated between the common electrode 70 and the pixel electrode 60, the electric field is generated as the fringe field including a vertical component thereof, and thus liquid crystal molecules (not shown) are driven.

FIG. 2 is a schematic cross-sectional view illustrating a portion taken along line II-II of FIG. 1.

As illustrated in the drawing, the pixel electrode 60 is disposed on a first substrate 11, a protective layer 80 is disposed on the pixel electrode 60, and the common electrode 70 is disposed on the protective layer 80.

Here, the common electrode 70 and the pixel electrode 60 are formed by depositing a transparent conductive material such as indium tin oxide (ITO).

In addition, a first orientation film 90a formed of a polyimide-based organic material is formed on the common electrode 70.

Here, the first substrate 11 is bonded to a second substrate 12 on which a second orientation film 90b is formed, wherein a liquid crystal layer 99 is interposed between the first substrate 11 and the second substrate 12.

In the FFS mode liquid crystal display device 100, the pixel electrode 60 and the common electrode 70 are spaced apart from each other with the protective layer 80 interposed therebetween, and a direct current voltage (DC voltage) applied when the liquid crystals are driven is charged at the protective layer 80 which is a high resistance layer.

The R-DC and electrical characteristics of the first orientation film 90a of FIG. 2 are important causes of generation of an afterimage, and since the R-DC changes a pretilt angle which is an optical parameter of the liquid crystal molecules in the liquid crystal cell and changes an orientation of molecular arrangement, the liquid crystal molecules cannot sensitively react to a changed signal voltage applied from the outside, and thus there is a problem in that, when an initial image is displayed for a long time, an afterimage of the initial image remains due to accumulated charges even when the initial image is changed.

SUMMARY

Accordingly, the present disclosure is directed to an array substrate and a liquid crystal display device including the same that substantially obviate one or more of the problems due to limitations and disadvantages of the related art.

An object of the present disclosure is to provide an array substrate and a liquid crystal display device including the same that solves the above-described conventional problem of a reduction of display quality due to a residual direct current voltage (R-DC).

Additional features and advantages of the present disclosure will be set forth in the description which follows, and in part will be apparent from the description, or may be learned by practice of the present disclosure. The objectives and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, there is provided an array substrate including a first substrate, a thin film transistor disposed on the first substrate, a first electrode located on the first substrate, a protective layer located on the first electrode, and a second electrode located on the protective layer, wherein the protective layer includes a first layer and a second layer, the first layer has a first resistance value, the second layer has a second resistance value, the first layer is located between the first electrode and the second layer, and the second resistance value is less than the first resistance value.

In another aspect of the present disclosure, a liquid crystal display device including the array substrate, a color filter substrate configured to face the array substrate, and a liquid crystal layer disposed between the color filter substrate and the array substrate.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims as well as the appended drawings.

It is to be understood that both the foregoing general description and the following detailed description are explanatory, and are intended to provide further explanation of the embodiments as claimed.

BRIEF DESCRIPTION OF THE DRAWINGS

The accompanying drawings, which are included to provide a further understanding of the disclosure, are incorporated in and constitute a part of this specification, illustrate implementations of the disclosure, and together with the description, serve to explain the principles of embodiments of the disclosure. In the drawings.

DETAILED DESCRIPTION

Reference will now be made in detail to embodiments of the disclosure, examples of which are illustrated in the accompanying drawings.

In a fringe-field switching (FFS) mode liquid crystal display device 100 of FIG. 2, a direct current voltage (DC voltage, and hereinafter, referred to as a DC) charged in a protective layer 80 of FIG. 2 which is a high resistance layer is released through a first orientation film 90a of FIG. 2 (hereinafter, referred to as a DC release) having a relatively low resistance.

Figure 1:
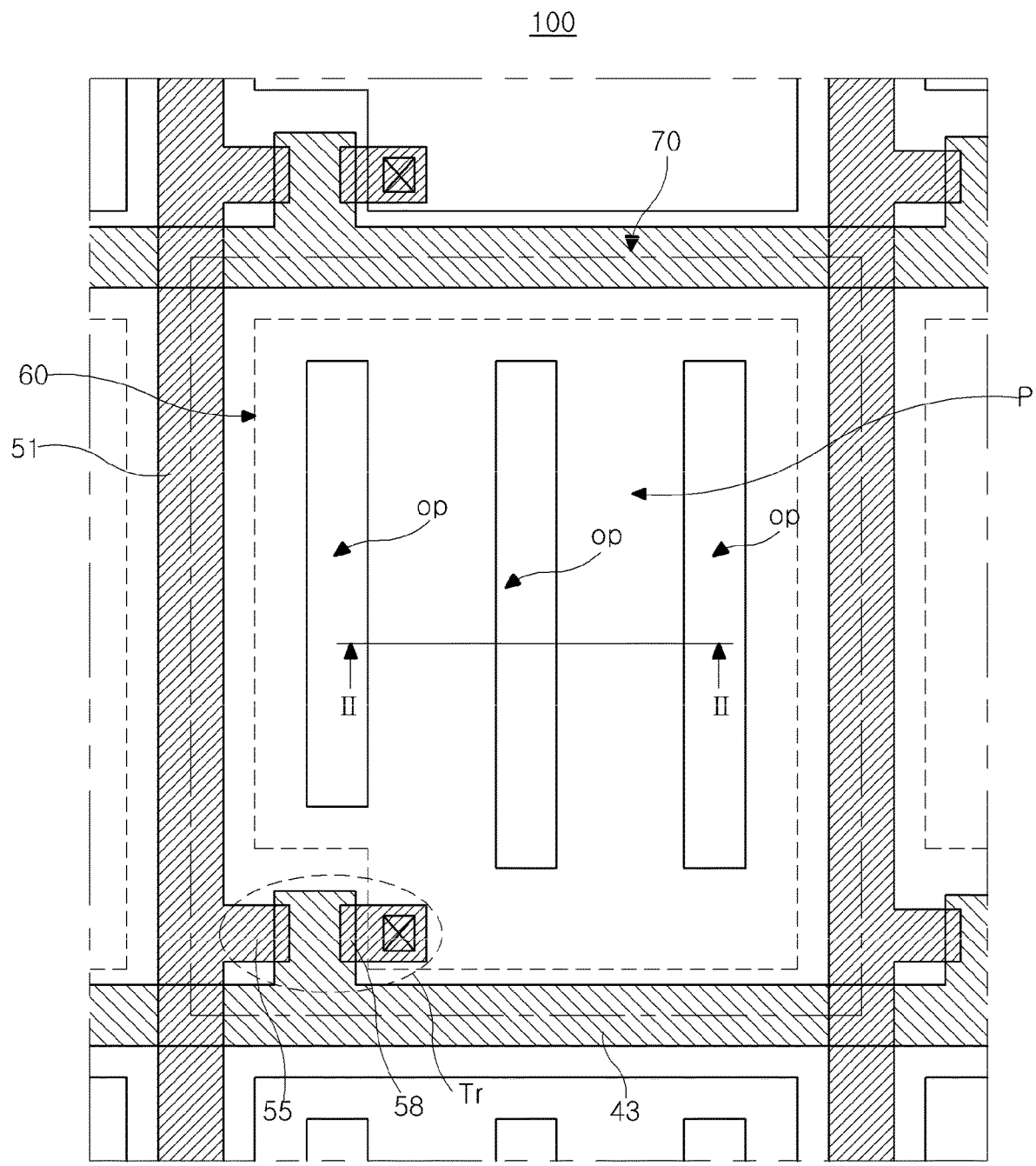
FIG. 1 is a schematic view illustrating a conventional fringe-field switching (FFS) mode liquid crystal display device.
Figure 2:
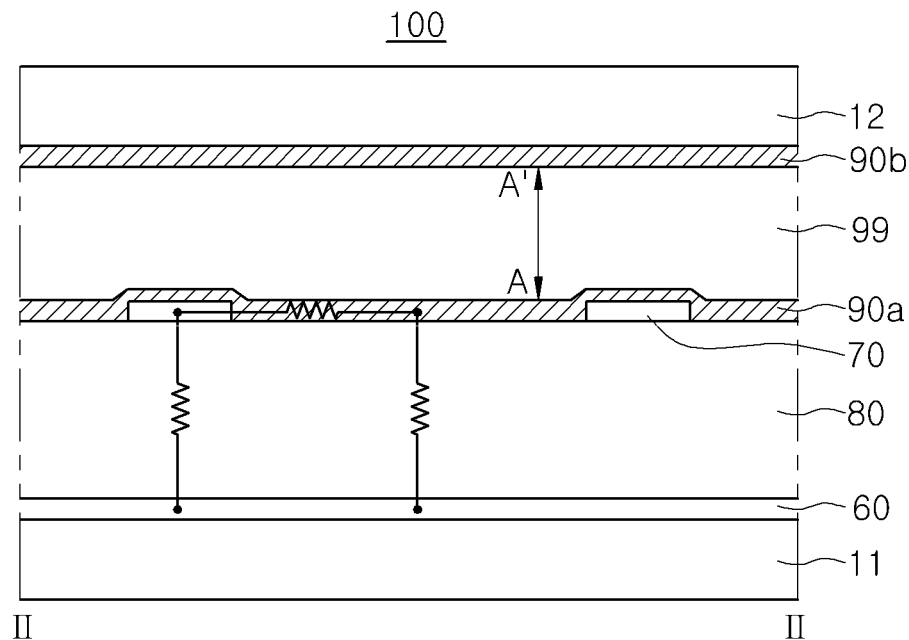
FIG. 2 is a schematic cross-sectional view illustrating a portion taken along line II-II of FIG. 1.

Meanwhile, since induction of a residual DC (R-DC) increases as an amount of polarization of the first alignment layer 90a of FIG. 2 increases, the fast DC release of the first orientation film 90a of FIG. 2 is important.

Here, the DC release through the first orientation film 90a of FIG. 2 depends on a resistance value, that is, electrical resistivity (Sam) of an orientation film.

That is, a speed of the DC release through the first orientation film 90a of FIG. 2 increases as the resistance value ($\Omega$cm) of the first orientation film 90a of FIG. 2 decreases, and thus generation of polarizing is suppressed.

Figure 3:
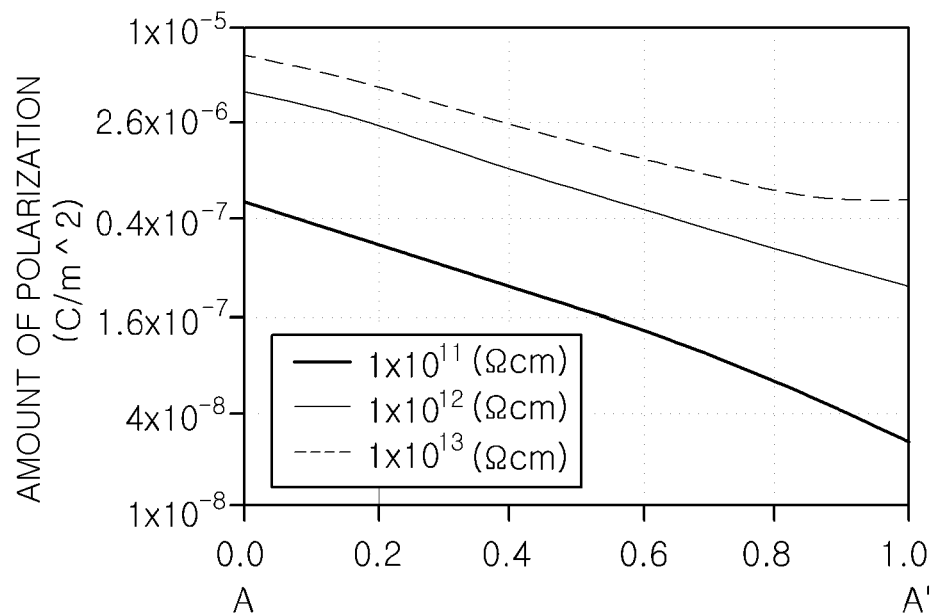
FIG. 3 is a graph showing amounts of polarization based on a resistance value of the orientation film.

FIG. 3 is a graph showing amounts of polarization based on a resistance value of the orientation film.

As illustrated in FIG. 3, a Y-axis denotes an amount of polarization, and an X-axis denotes a distance A-A' from an interface of the first orientation film 90a of FIG. 2 to an interface of the second orientation film 90b of FIG. 2.

It can be seen that an amount of polarization generated on an interface A of the first orientation film 90a of FIG. 2 decreases as the resistance value ($\Omega$cm) of the first orientation film 90a of FIG. 2 decreases.

Accordingly, since the amount of polarization is decreased, the R-DC is minimized, and thus an afterimage based on the R-DC may be prevented.

Accordingly, it is preferable to decrease the resistance value of the first orientation film 90a of FIG. 2 and increase the resistance value ($\Omega$cm) of the protective layer 80 to reduce an afterimage in the FFS mode liquid crystal display device 100 of FIG. 2.

However, as described above, since the first orientation film 90a of FIG. 2 is formed of a polyimide-based organic material, there is a problem in that an orientation force decreases in a case in which a polyimide is formed to have a low resistance, and thus there is a limitation in reducing the afterimage using the first orientation film 90a of FIG. 2.

Accordingly, the present disclosure proposes an array substrate capable of reducing an afterimage without decreasing an orientation force of the first orientation film and a liquid crystal display device including the same.

Hereinafter, embodiments of the present disclosure will be described with reference to the accompanying drawings.

First Embodiment

Figure 4:
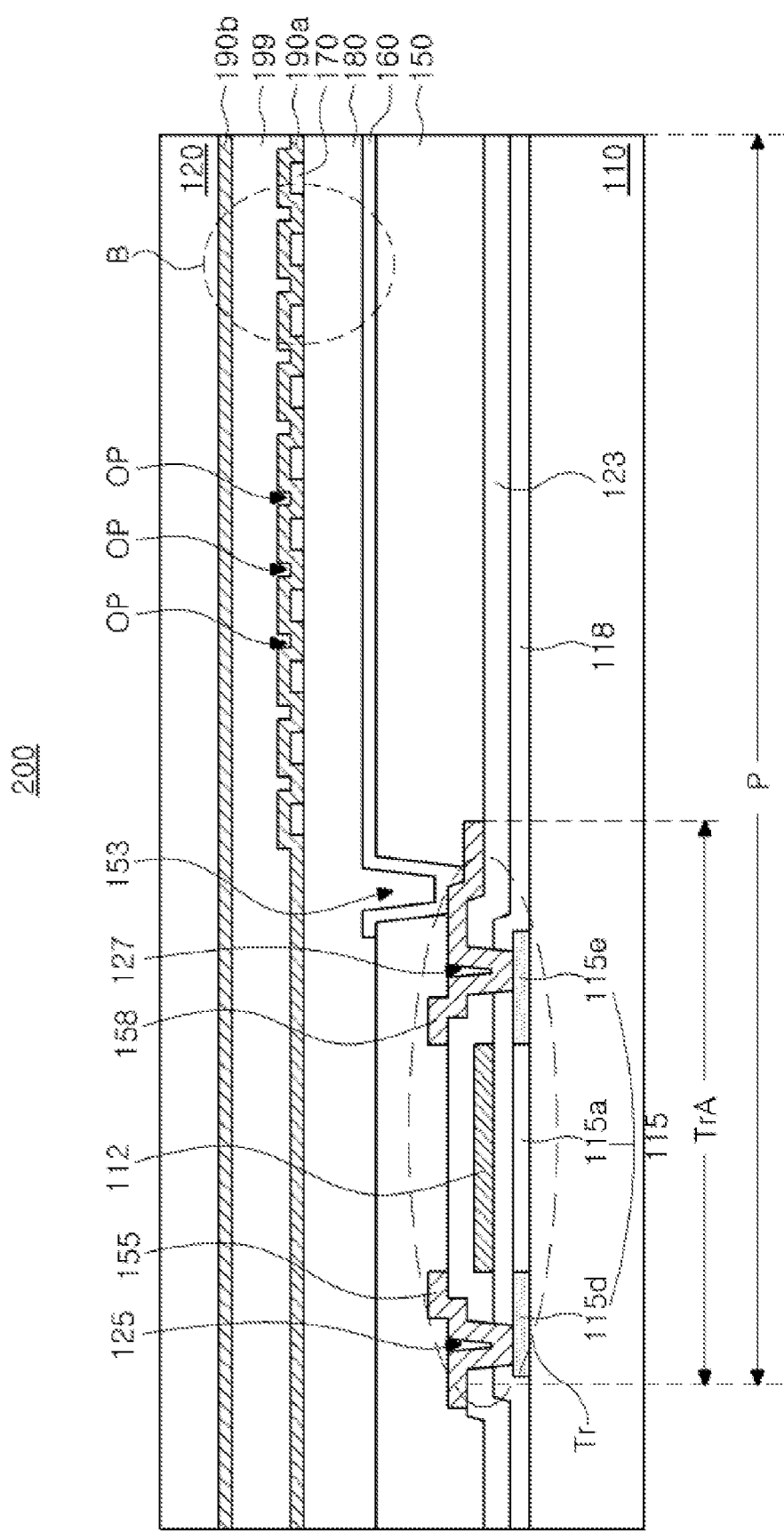
FIG. 4 is a schematic cross-sectional view illustrating a liquid crystal display device according to a first embodiment of the present disclosure.
Figure 5:
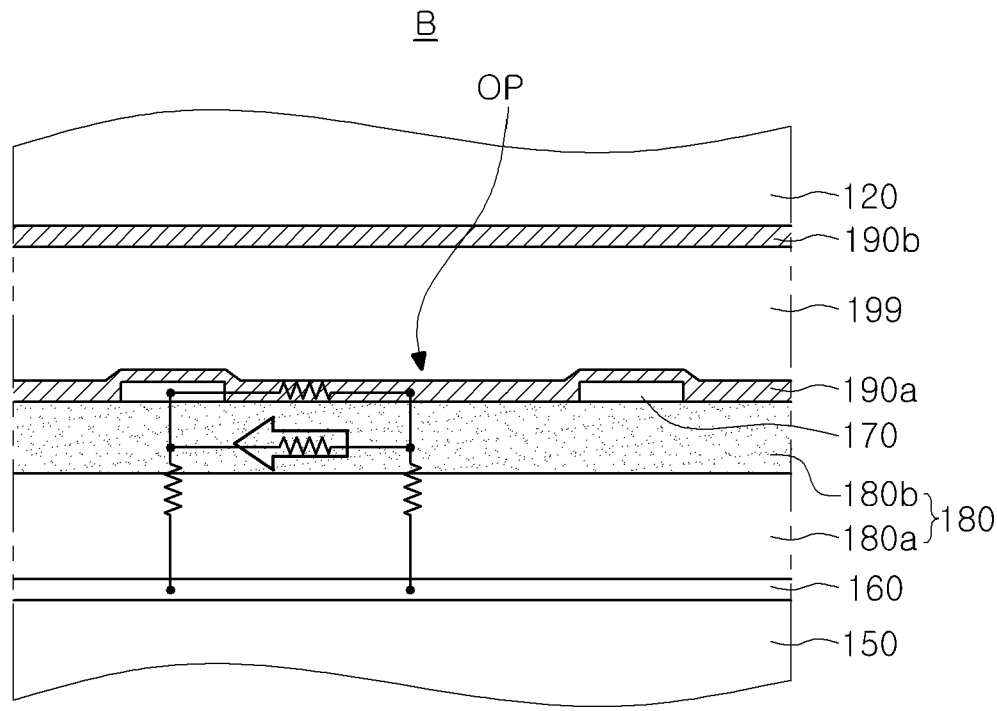
FIG. 5 is an enlarged view illustrating portion B of the liquid crystal display device according to the first embodiment of the present disclosure.

FIG. 4 is a schematic cross-sectional view illustrating a liquid crystal display device according to a first embodiment of the present disclosure, and FIG. 5 is an enlarged view illustrating portion B of the liquid crystal display device according to the first embodiment of the present disclosure.

As illustrated in FIG. 4, a liquid crystal display device 200 according to the first embodiment of the present disclosure includes a first substrate 110 on which a first electrode 160 and a second electrode 170 are formed, a second substrate 120 facing the first substrate 110, and a liquid crystal layer 199 formed between the first substrate 110 and the second substrate 120. Here, the first substrate 110 may be referred to as an array substrate, and the second substrate 120 including a color filter layer may be referred to as a color filter substrate.

In an element area TrA of each pixel area P of the first substrate 110 in which a thin film transistor is formed, a semiconductor layer 115 is formed, a gate insulating film 118 is formed on the semiconductor layer 115 on an entire surface of the substrate 110, and a gate electrode 112 is formed on the gate insulating film 118 to correspond to a central portion of the semiconductor layer 115.

In addition, an interlayer insulating film 123 including semiconductor layer contact holes 125 and 127 configured to expose both edges of the semiconductor layer 115, that is, source and drain areas 115d and 115e, is formed on the gate electrode 112 on the entire surface of the first substrate 110.

Here, the source and drain areas 115d and 115e may be doped with high concentration impurities and a channel 115a is between the source and drain areas 115d and 115e of the semiconductor layer 115.

A thin film transistor Tr having a co-planar structure is illustrated in FIG. 4, but the present disclosure is not limited thereto. For example, the thin film transistor Tr having a bottom gate structure may also be used.

In addition, source and drain electrodes 155 and 158 which are respectively in contact with the source area 115d and the drain area 115e through the semiconductor layer contact holes 125 and 127 and are spaced apart from each other may be formed on the interlayer insulating film 123, and an insulating layer 150 including a drain contact hole 153 configured to expose the drain electrode 158 may be formed on the source and drain electrodes 155 and 158. The first electrode 160 and the second electrode 170 may be disposed on the insulating layer 150, and a protective layer 180 may be interposed between the first electrode 160 and the second electrode 170.

Meanwhile, in the first embodiment, the drain electrode 158 is in contact with the first electrode 160 through the drain contact hole 153, but in another embodiment, the drain electrode 158 may be in contact with the second electrode 170.

In addition, in the first embodiment, the first electrode 160 is located on the thin film transistor Tr, but in another embodiment, the thin film transistor Tr and the first electrode 160 may be formed on the same layer. For example, the first electrode 160 may be formed on the interlayer insulating film 123.

Meanwhile, a first orientation film 190a may be formed on the second electrode 170.

Since the protective layer 180 is formed between the first electrode 160 and the second electrode 170, when a voltage is applied to the first electrode 160 and the second electrode 170, a fringe field is generated between the first electrode 160 and the second electrode 170.

Accordingly, the liquid crystal display device 200 according to the first embodiment is a FFS mode liquid crystal display device having.

Here, one of the first electrode 160 and the second electrode 170 may be a pixel electrode, and the remaining one may be a common electrode.

Meanwhile, a second orientation film 190b may be formed below the second substrate 120 facing the first substrate 110, and although not illustrated in the drawings, a black matrix (not shown) configured to prevent light leakage and a color filter layer (not shown) formed with color filter patterns having red, green, and blue to correspond to each pixel area P may be formed between the second substrate 120 and the second orientation film 190b.

In addition, an overcoat layer (not shown) may be formed below the color filter layer to planarize a surface of the color filter and protect the color filter layer.

The above-described FFS mode liquid crystal display device 200 may be formed by bonding the first substrate 110 to the second substrate 120, wherein the liquid crystal layer 199 is interposed therebetween.

The above-described configuration of the FFS mode liquid crystal display device 200 is one example, but the FFS mode liquid crystal display device 200 is not limited thereto.

Here, in the liquid crystal display device 200 according to the first embodiment of the present disclosure, the protective layer 180 between the first electrode 160 and the second electrode 170 may be formed as a multilayer.

That is, as illustrated in FIG. 5, the protective layer 180 between the first electrode 160 and the second electrode 170 may be formed as double layers 180a and 180b.

More specifically, the first electrode 160 having a plate shape is disposed on the insulating layer 150, and a first layer 180a of the protective layer 180 is formed on the first electrode 160.

In addition, a second layer 180b may be formed on the first layer 180a of the protective layer 180, the second electrode 170 having a plurality of openings OP each having a bar shape may be disposed on the second layer.

Each of the first electrode 160 and the second electrode 170 may be formed of a transparent conductive material, for example, ITO or indium zinc oxide (IZO).

In addition, each of the first layer 180a and the second layer 180b of the protective layer 180 disposed between the first electrode 160 and the second electrode 170 may be formed by depositing an inorganic insulating material, for example, silicon nitride (SiNx).

Here, the first layer 180a and the second layer 180b of the protective layer have different resistance values, i.e., different electrical resistivities.

That is, the first layer 180a is formed as a high resistance layer. For example, the resistance value of the first layer 180a may be $10^{13}$ Ωcm to $10^{16}$ Ωcm, but is not limited thereto, and the first layer 180a may have a high resistance value of $10^{13}$ Ωcm or more.

However, the second layer 180b is formed as a low resistance layer. For example, the second layer 180b may have a resistance value of 1/1000 to 1/10 of that of the first layer 180a, but is not limited thereto.

The difference of resistance values between the first layer 180a and the second layer 180b may be obtained by changing a deposition condition in the same process. For example, the first layer 180a and the second layer 180b may be formed to have different resistance values by adjusting i) a ratio of source gases ($NH_3$ and $SiH_4$), ii) process temperature, □) process pressure, and the like in a manufacturing process thereof.

In addition, a thickness of the second layer 180b may be less than or equal to that of the first layer 180a.

Here, the thickness of the second layer 180b may be 3000 Å or less. For example, the thickness of the second layer 180b may be in a range of 200 Å to 3000 Å, but is not limited thereto.

In addition, the second electrode 170 including the plurality of openings OP may be disposed on the second layer 180b of the protective layer 180.

In addition, the first orientation film 190a is formed on the second electrode 170. That is, the first orientation film 190a may be in contact with the second electrode 170 and the second layer 180b.

Here, the first orientation film 190a may be formed through a deposition process for a polymer thin film and an orientation process for the first orientation film 190a in a predetermined direction.

In addition, the first orientation film 190a may be formed of a polyimide-based organic material, but is not limited thereto.

Here, the first orientation film 190a may have a resistance value greater than or equal to that of the second layer 180b of the protective layer 180.

As described above, in the liquid crystal display device 200 of FIG. 4 according to the first embodiment of the present disclosure, the protective layer 180 between the first electrode 160 and the second electrode 170 is formed with the first layer 180a having a high resistance and the second layer 180b having a low resistance.

Accordingly, since a low resistance layer is disposed below the first orientation film 190a, a polarization phenomenon of an interface of the first orientation film 190a is suppressed and a DC applied when liquid crystals are driven may be simultaneously speedily released through the second layer 180b which is the low resistance layer.

Accordingly, an afterimage due to a residual DC (R-DC) may be effectively reduced.

Particularly, since a decrease in an orientation force is induced when the first orientation film 190a is designed to have a low resistance, an upper portion of the protective layer 180 is formed as a low resistance layer instead of designing the first orientation film 190a to have a low resistance, and thus a high orientation force of the first orientation film 190a may be maintained and an afterimage may be effectively reduced.

Figure 6:
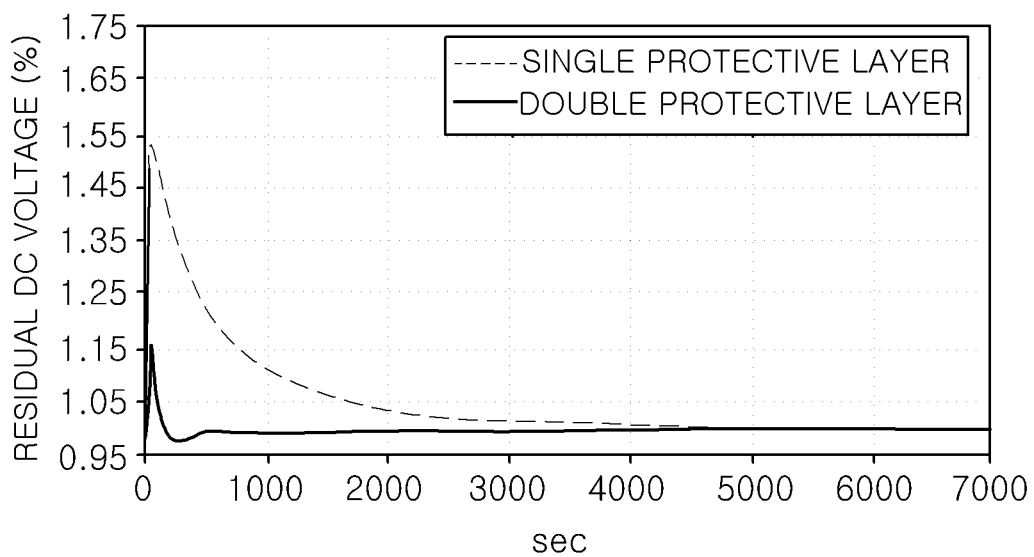
FIG. 6 is a graph showing DC releases of the liquid crystal display device according to the first embodiment of the present disclosure and a conventional liquid crystal display device.

FIG. 6 is a graph showing DC releases of the liquid crystal display device according to the first embodiment of the present disclosure and a conventional liquid crystal display device.

As illustrated in FIG. 6, a Y-axis denotes an R-DC, and an X-axis denotes time (second). When an amount of R-DC and a reduction rate per time of the R-DC of the liquid crystal display device 200 of FIG. 4 according to the first embodiment of the present disclosure are compared to those of the conventional liquid crystal display device 100 of FIG. 2 including the single protective layer 80 of FIG. 2, it can be seen that the amount of R-DC decreases and the reduction rate per time increases in the liquid crystal display device 200 of FIG. 4 according to the first embodiment of the present disclosure.

As described above, in the first embodiment of the present disclosure, since the protective layer 180 of FIG. 5 between the first electrode 160 of FIG. 5 and the second electrode 170 of FIG. 5 is formed as the double layer including the first layer 180a of FIG. 5 which is the high resistance layer and the second layer 180b of FIG. 5 which is the low resistance layer, a polarization phenomenon is suppressed, the amount of R-DC decreases and the reduction rate of R-DC per time through the second layer 180b which is the low resistance layer increases simultaneously, and thus an afterimage effect can be effectively reduced while a high orientation force is maintained.

Figure 7:
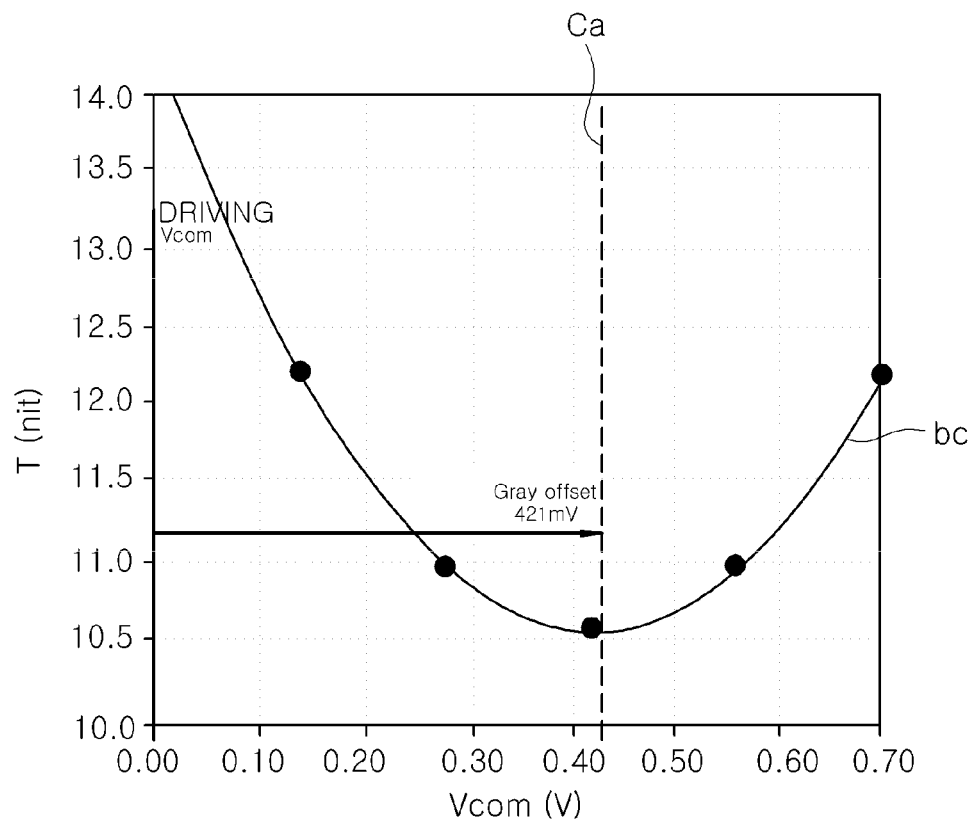
FIG. 7 is a graph showing a change in a gray offset of the liquid crystal display device according to the first embodiment of the present disclosure.

FIG. 7 is a graph showing a change in a gray offset of the liquid crystal display device according to the first embodiment of the present disclosure.

As illustrated in FIG. 7, in the case of the first embodiment of the present disclosure, the DC release time decreases through the protective layer 180 having the double layer structure including the high resistance layer and the low resistance layer, but a voltage difference (hereinafter, referred to as a gray offset) of 421 mV is generated between a driving Vcom and a central axis Ca of a brightness curve bc.

In this case, a brightness difference may be induced due to asymmetry between positive and negative polarities.

In a case in which a dry etching process is performed to form a contact hole CH configured to expose a common line, a pad, or the like, the contact hole of the first layer 180a and the second layer 180b is formed in a reverse tapered shape due to an etch rate difference between the first layer 180a which is the high resistance layer and the second layer 180b which is the low resistance layer.

In this case, disconnection of the contact hole CH may occur, and thus a pixel defect may occur.

As described above, in the first embodiment of the present disclosure, since the protective layer 180 between the first electrode 160 and the second electrode 170 is formed as the double layer including the first layer 180a which is the high resistance layer and the second layer 180b which is the low resistance layer, the DC release time of the R-DC may decrease due to the second layer 180b which is the low resistance layer, but problems with a gray offset and patterning process characteristics occur.

Second Embodiment

A liquid crystal display device according to a second embodiment of the present disclosure is different in a structure of a protective layer from the liquid crystal display device of the first embodiment, and will be described in detail below.

Figure 8:
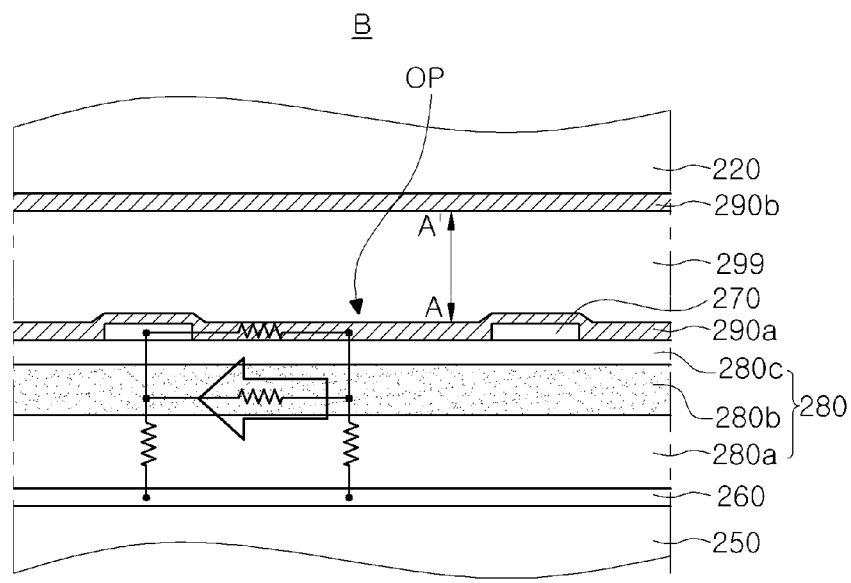
FIG. 8 is an enlarged cross-sectional view of a liquid crystal display device according to a second embodiment of the present disclosure and corresponds to portion B of FIG. 4.

FIG. 8 is an enlarged cross-sectional view of a liquid crystal display device according to a second embodiment of the present disclosure and corresponds to portion B of FIG. 4.

That is, as illustrated in FIG. 8, a protective layer 280 between a first electrode 260 and a second electrode 270 may be formed as a triple layer (280a, 280b, and 280c).

More specifically, the first electrode 260 having a plate shape is disposed on an insulating layer substrate 250, and a first layer 280a of the protective layer 280 is formed on the first electrode 260.

In addition, a second layer 280b may be formed on the first layer 280a of the protective layer 280, a third layer 280c may be formed on the second layer 280b, and a second electrode 270 including a plurality of openings OP may be formed on the third layer 280c.

That is, the third layer 280c is disposed between the second electrode 170 of FIG. 5 and the second layer 180b of FIG. 5 of the protective layer 180 of FIG. 5 in the structure of the protective layer 180 of FIG. 5 of the first embodiment.

The first electrode 260 and the second electrode 270 may be formed of a transparent conductive material, for example, ITO or IZO.

In addition, the first to third layers 280a, 280b, and 280c of the protective layer 280 disposed between the first electrode 260 and the second electrode 270 may be formed by depositing an inorganic insulating material, for example, silicon nitride ($SiN_x$).

Here, the first layer 280a and the third layer 280c of the protective layer 280 have different resistance values from that of the second layer 280b.

That is, the first layer 280a and the third layer 280c are formed as high resistance layers. For example, the resistance values of the first layer 280a and the third layer 280c may be in a range of $10^{13}$ Ωcm to $10^{16}$ Ωcm, but is not limited thereto, and the first layer 280a and the third layer 280c may have high resistance values of $10^{13}$ Ωcm or more.

However, the second layer 280b is formed as a low resistance layer. For example, the second layer 280b may have a resistance value of 1/1000 to 1/10 of those of the first layer 280a and the third layer 280c, but is not limited thereto.

The difference in a resistance value between the first to third layers 280a, 280b, and 280c may be obtained by changing a deposition condition in the same process. For example, the first to third layers 280a, 280b, and 280c may be formed to have different resistance values by adjusting i) a ratio of source gases ($NH_3$ and $SiH_4$), ii) process temperature, □) process pressure, and the like in the manufacturing process.

In addition, the thickness of the second layer 280b may be less than or equal to that of the first layer 280a and may be greater than that of the third layer 280c.

In addition, it is preferable that the thickness of the second layer 280b be less than the thickness of the protective layer 280 including the first to third layers 280a, 280b, and 280c, but the thickness of the second layer 280b is not limited thereto.

Here, the thickness of the second layer 280b may be 3000 Å or less. For example, the thickness of the second layer 280b may be in a range of 200 Å to 3000 Å, but is not limited thereto.

In addition, it is preferable that the third layer 280c, which is a high resistance layer to prevent the problems of an excessive gray offset and with patterning process characteristics (disconnection of a contact hole) brought about by the first embodiment, be formed to have a thickness as small as possible in a process. For example, the thickness of the third layer 280c is 200 Å, but is not limited thereto.

In addition, the second electrode 270 including the plurality of openings OP may be disposed on the third layer 280c of the protective layer 280.

In addition, a first orientation film 290a is formed on the second electrode 270. That is, the first orientation film 290a may be in contact with the second electrode 270 and the third layer 280c.

Here, the first orientation film 290a may be formed through a deposition process for a polymer thin film and an orientation process for the first orientation film 290a in a predetermined direction.

In addition, the first orientation film 290a may be formed of a polyimide-based organic material, but is not limited thereto.

Here, the first orientation film 290a may have a resistance value greater than or equal to that of the second layer 280b of the protective layer 280.

Next, the liquid crystal display device of the present disclosure may be formed by bonding a first substrate 110 of FIG. 4 and a second substrate 220 on which a second orientation film 290b is formed, wherein the first substrate 110 of FIG. 4 and the second substrate 220 face each other and a liquid crystal layer 299 is interposed therebetween.

Here, the first substrate 110 of FIG. 4 may be an array substrate, and the second substrate 220 may be a color filter substrate.

As described above, in the liquid crystal display device according to the second embodiment of the present disclosure, the protective layer 280 between the first electrode 260 and the second electrode 270 may be formed with the first layer 280a having a high resistance, the second layer 280b having a low resistance, and the third layer 280c having a high resistance.

Accordingly, since the protective layer 280 formed as the triple layer is disposed below the first orientation film 290a, a DC applied when liquid crystals are driven may be speedily released through the second layer 280b which is the low resistance layer (decrease in a DC release time), and since the third layer 280c which is a high resistance layer is disposed on the second layer 280b which is the low resistance layer, problems with a gray offset and patterning process characteristics (disconnection of a contact hole) brought about by the first embodiment may be prevented.

In addition, since a polarization phenomenon of an interface of the first orientation film 290a may be suppressed, an R-DC may be decreased.

Particularly, since a decrease in an orientation force is induced when the first orientation film 290a is designed to have a low resistance, a low resistance layer is formed on the protective layer 280 instead of designing the first orientation film 290a to have the low resistance, and thus an afterimage may be effectively reduced while a high orientation force of the first orientation film 190a is maintained.

In addition, since the third layer 280c which is a high resistance layer is disposed on the second layer 280b which is the low resistance layer, problems of an excessive gray offset and with patterning process characteristics (disconnection of a contact hole) brought about by the first embodiment can be prevented.

Third Embodiment

For convenience of description, specific descriptions of elements which are the same as or similar to those of the first embodiment may be omitted below.

Figure 9:
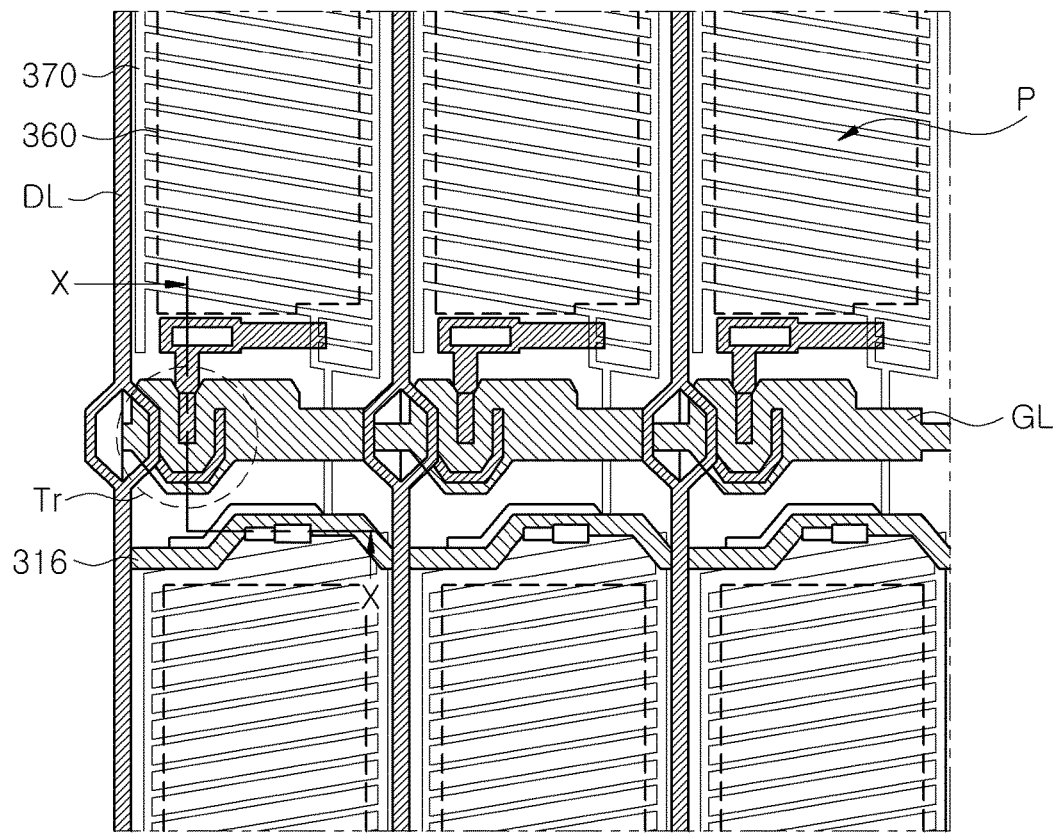
FIG. 9 is a schematic view illustrating a liquid crystal display device according to a third embodiment of the present disclosure.
Figure 10:
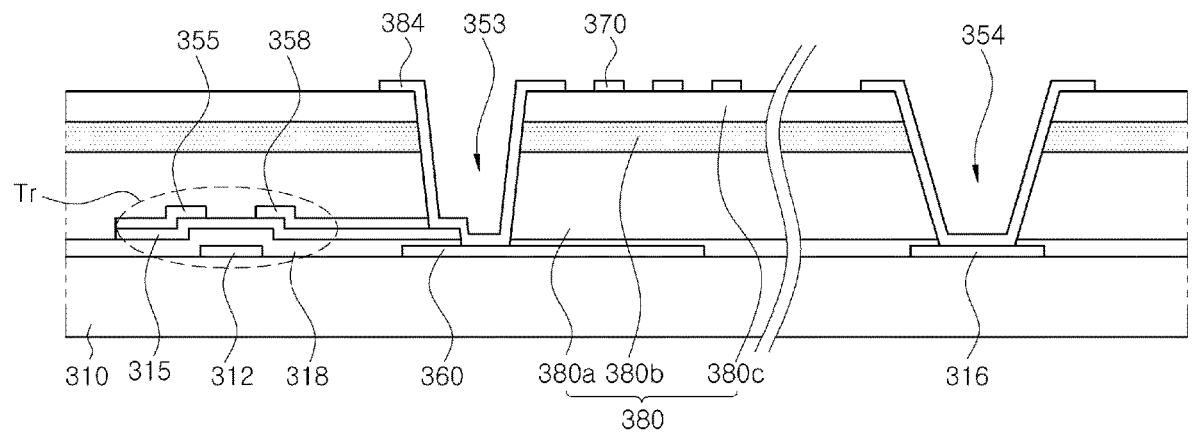
FIG. 10 is a cross-sectional view illustrating the liquid crystal display device according to the third embodiment of the present disclosure.

FIG. 9 is a schematic view illustrating a liquid crystal display device according to a third embodiment of the present disclosure, and FIG. 10 is a cross-sectional view illustrating the liquid crystal display device along X-X' according to the third embodiment of the present disclosure.

As illustrated in the drawings, a plurality of gate lines GL extending in a first direction and spaced a predetermined distance from each other, and a plurality of data lines DL which intersect with the gate lines GL and extending in a second direction are formed on a first substrate 310.

Here, a pixel area P is formed between and defined by the gate lines GL and the data lines DL which intersect with each other.

Meanwhile, a common line 316 may also be disposed to be spaced a predetermined distance from and parallel to the gate line GL.

In addition, in each pixel area P, a thin film transistor Tr which is a switching element connected to the gate and data lines GL and DL is formed around a portion at which the gate line GL intersects with the data line DL.

Here, the thin film transistor Tr may include a gate electrode 312 disposed on the first substrate 310, a gate insulating film 318 disposed on the gate electrode 312, a semiconductor layer 315 disposed on the gate insulating film 318, and a source electrode 355 and a drain electrode 358 spaced apart from each other and disposed on the semiconductor layer 315.

In addition, the first electrode 360 and the common line 316 may be disposed on the same layer and formed of the same material as the gate electrode 312.

In addition, a protective layer identical to the protective layer 180 of FIG. 5 and the protective layer 280 of FIG. 8 according to the first and second embodiments is disposed on the thin film transistor Tr, and a second electrode 370 including a plurality of openings is disposed on the protective layer identical to the protective layer 180 of FIG. 5 and the protective layer 280 of FIG. 8.

Hereinafter, a protective layer 380 is described on the basis of the triple layer structure 280 of FIG. 8 according to the second embodiment.

Meanwhile, the drain electrode 358 and the first electrode 360 of the thin film transistor Tr may be connected through a jumping hole 353 passing through the protective layer 380 and the thin film transistor Tr, and a connection pattern 384 disposed on the jumping hole 353.

Here, the connection pattern 384 may be formed of the same material and disposed on the same layer as the second electrode 370.

Accordingly, the connection pattern 384 formed of a metal material may be in contact with a side surface of the protective layer 380.

Particularly, since the connection pattern 384 is in contact with a second layer 380b which is a low resistance layer, a DC applied when liquid crystals are driven may be speedily released through the second layer 380b which is the low resistance layer, the connection pattern 384, and the first electrode 360 (decrease in a DC release time).

In addition, since a third layer 380c which is a high resistance layer is disposed on the second layer 380b which is the low resistance layer, occurrence of a reverse tapered shape is prevented when a jumping hole 353 is formed, and disconnection of the connection pattern 384 may be prevented.

In addition, the protective layer 380 may further include a contact hole 354 configured to connect the second electrode 370 to the common line 316.

Here, the second layer 380b which is the low resistance layer of the protective layer 380 is in contact with the second electrode 370 through the contact hole 354.

As described above, the common line 316 may be formed of the same material and disposed on the same layer as the gate electrode 312, and the second electrode 370 is in direct contact with the common line 316 through the contact hole 354.

Accordingly, the second electrode 370 may be in contact with the side surface of the protective layer 380.

Particularly, since the second electrode 370 is in contact with the second layer 380b which is the low resistance layer, a DC applied when liquid crystals are driven may be effectively released through the second layer 380b which is the low resistance layer, the second electrode 370 formed of a metal material, and the common line 316 (decrease in a DC release time).

In addition, since the third layer 380c which is the high resistance layer is disposed on the second layer 380b which is the low resistance layer, occurrence of a reverse tapered shape is prevented when the contact hole 354 is formed, and thus disconnection of the second electrode 370 may be prevented in an area of the contact hole 354.

Figure 11:
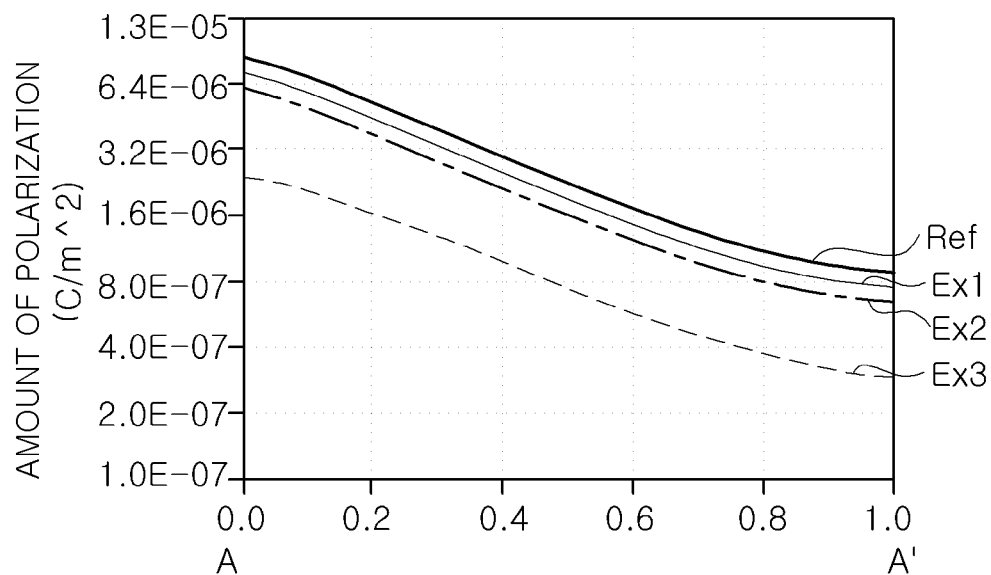
FIG. 11 is a graph showing a comparison of amounts of polarization of a conventional protective layer and a protective layer according to the second embodiment of the present disclosure.

FIG. 11 is a graph showing a comparison of amounts of polarization of a conventional protective layer and the protective layer according to the second embodiment of the present disclosure.

As illustrated in the drawing, a Y-axis denotes an amount of polarization, an X-axis denotes a distance (A-A') between an interface of a first orientation film 290a of FIG. 8 and an interface of a second orientation film 290b of FIG. 8.

In addition, a comparative line Ref denotes an amount of polarization in a case in which the protective layer 80 of FIG. 2 is a single layer, and Experimental Examples 1, 2, and 3 Ex1, Ex2, and Ex3 for showing amounts of polarization in the case in which the protective layer 280 of FIG. 8 is the triple layer are illustrated.

The inventors of the present disclosure experimentally checked an amount of polarization based on a resistance ratio and a thickness ratio of the second layer 280b of FIG. 8 in the case in which the protective layer 280 of FIG. 8 is formed as the triple layer in comparison with the case of the protective layer 80 of FIG. 2 which is the single layer.

The following Table 1 shows a resistance ratio of the second layer 280b of FIG. 8 to the first layer 280a of FIG. 8 and a thickness ratio of the second layer 280b of FIG. 8 to the total thickness of the protective layer 280 of FIG. 8 in the case in which the protective layer 280 of FIG. 8 is formed as the triple layer.

TABLE 1

|  | Ex1 | Ex2 | Ex3 |
| --- | --- | --- | --- |
| Resistance ratio of second layer to first layer | 1/10 | 1/10 | 1/100 |
| Thickness ratio of second layer to protective layer | 1/3 | 1/4 | 1/3 |

As illustrated in FIG. 11, it can be seen that amounts of polarization in the case of Experimental Examples 1, 2, and 3 Ex1, Ex2, and Ex3 in which the first layer 280a of FIG. 8 is formed as the triple layer are decreased from that of Comparative Example Ref in which the protective layer 80 of FIG. 2 is formed as the single layer.

In addition, in the case in which the protective layer 280 of FIG. 8 is formed as the triple layer, it can be seen that an amount of polarization of the Experimental Example 2 Ex2 further decreases compared to that of the Experimental Example 1 Ex1, and an amount of polarization of Experimental Example 3 Ex3 decreases compared to that of Experimental Example 1 Ex1.

Accordingly, it can be seen that an amount of polarization decreases as the thickness of the second layer 280b of FIG. 8 which is the low resistance layer is relatively thin compared to the total thickness of the protective layer 280 of FIG. 8, and the amount of polarization decreases as the resistance value of the second layer 280b of FIG. 8, which is the low resistance layer is relatively low compared to the first layer 280a of FIG. 8 which is formed as the triple layer and is the high resistance layer, is lower.

Figure 12:
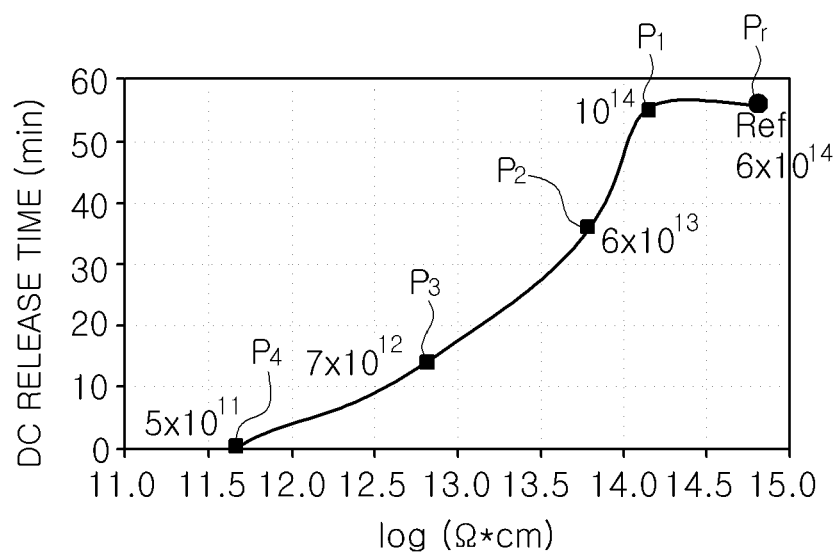
FIG. 12 is a graph showing a change in a DC release time based on a resistance value.

FIG. 12 is a graph showing a change in a DC release time based on a resistance value.

As illustrated in the graph, a Y-axis denotes a DC release time (minutes) and an X-axis denotes a resistance value (Ωcm) on a log scale.

Here, a circular mark of the graph means a case in which the protective layer 80 of FIG. 2 is the single layer, and a rectangular mark means a case in which the protective layer 280 of FIG. 8 is the triple layer.

P1 to P4 denote resistance values (Ωcm) of the second layer 280b of FIG. 8 of the protective layer 280 of FIG. 8 which is the triple layer structure.

TABLE 2

| | Pr | P1 First and third layers | P1 Second layer | P2 First and third layers | P2 Second layer | P3 First and third layers | P3 Second layer | P4 First and third layers | P4 Second layer |
|---|---|---|---|---|---|---|---|---|---|
| Resistance value (Ω*cm) | $6 \times 10^{14}$ | $6 \times 10^{14}$ | $10^{14}$ | $6 \times 10^{14}$ | $6 \times 10^{13}$ | $6 \times 10^{14}$ | $7 \times 10^{12}$ | $6 \times 10^{14}$ | $5 \times 10^{11}$ |
| DC release time (min) | 56 | | 55 | | 36 | | 14 | | 0.5 |

As shown in Table 2, the resistance values of a single layer Pr and triple layers P1, P2, P3, and P4 which have different resistance values of the second layer 280b of FIG. 8 and a DC release time based thereon are shown.

In the case in which the protective layer 80 of FIG. 2 is the single layer, the protective layer 80 of FIG. 2 has the resistance value of $6 \times 10^{14}$ Ωcm, and in the case in which the protective layer 280 of FIG. 8 is formed as the triple layer, the first layer 280a of FIG. 8 and the third layer 280c of FIG. 8 have the same resistance value of $6 \times 10^{14}$ Ωcm.

Accordingly, even in the case in which the protective layer 280 of FIG. 8 is formed as the triple layer, it can be seen that the DC release time decreases as the resistance of the second layer 280b of FIG. 8, which is the low resistance layer is relatively low compared to the first layer 280a of FIG. 8 and the third layer 280c of FIG. 8 which are the high resistance layers in the protective layer 280 of FIG. 8, decreases.

That is, since the low resistance layer is disposed in the protective layer 280 of FIG. 8, a DC applied when liquid crystals are driven may be speedily released through the second layer 280b of FIG. 8 which is the low resistance layer, and thus an afterimage based on the R-DC can be effectively reduced.

Here, it is preferable that the resistance of the second layer 280b of FIG. 8 which is the low resistance layer be 1/1000 to 1/10 of those of the first layer 280a of FIG. 8 and the third layer 280c of FIG. 8 which are the high resistance layers of the protective layer 280 of FIG. 8, but the resistance of the second layer 280b of FIG. 8 is not limited thereto.

Figure 13A:
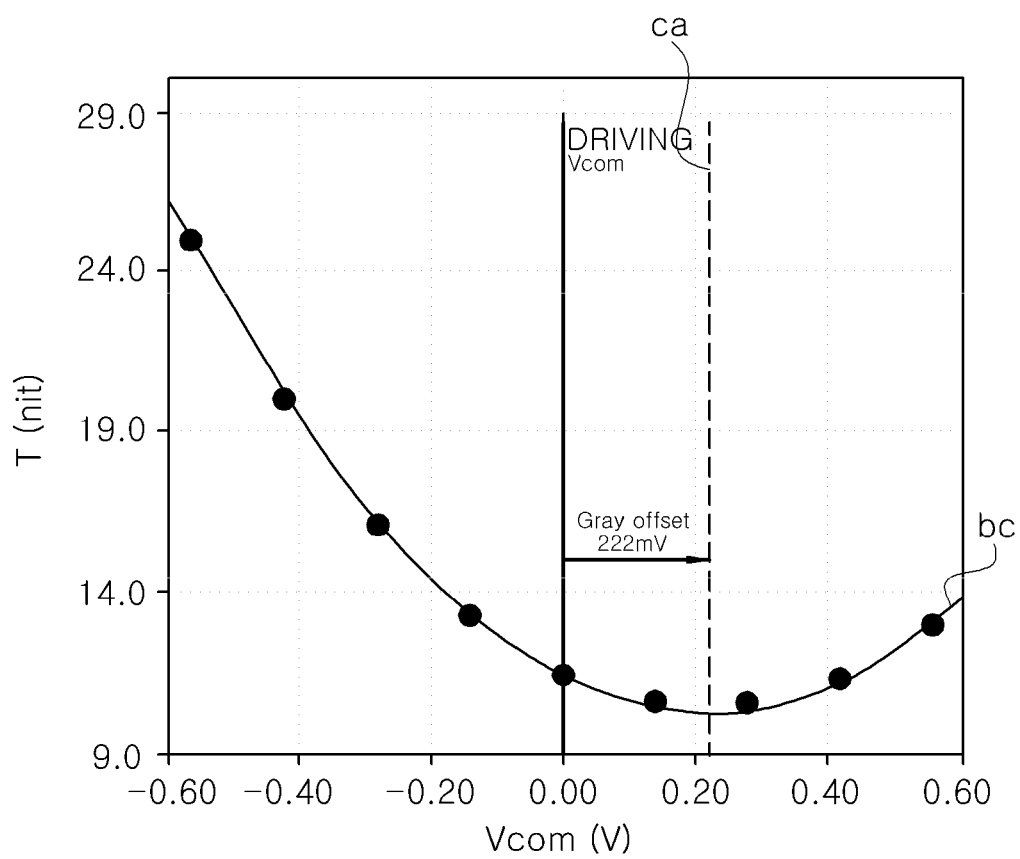
FIGS. 13A and 13B are graphs showing a value of a gray offset based on a thickness of a second layer.
Figure 13B:
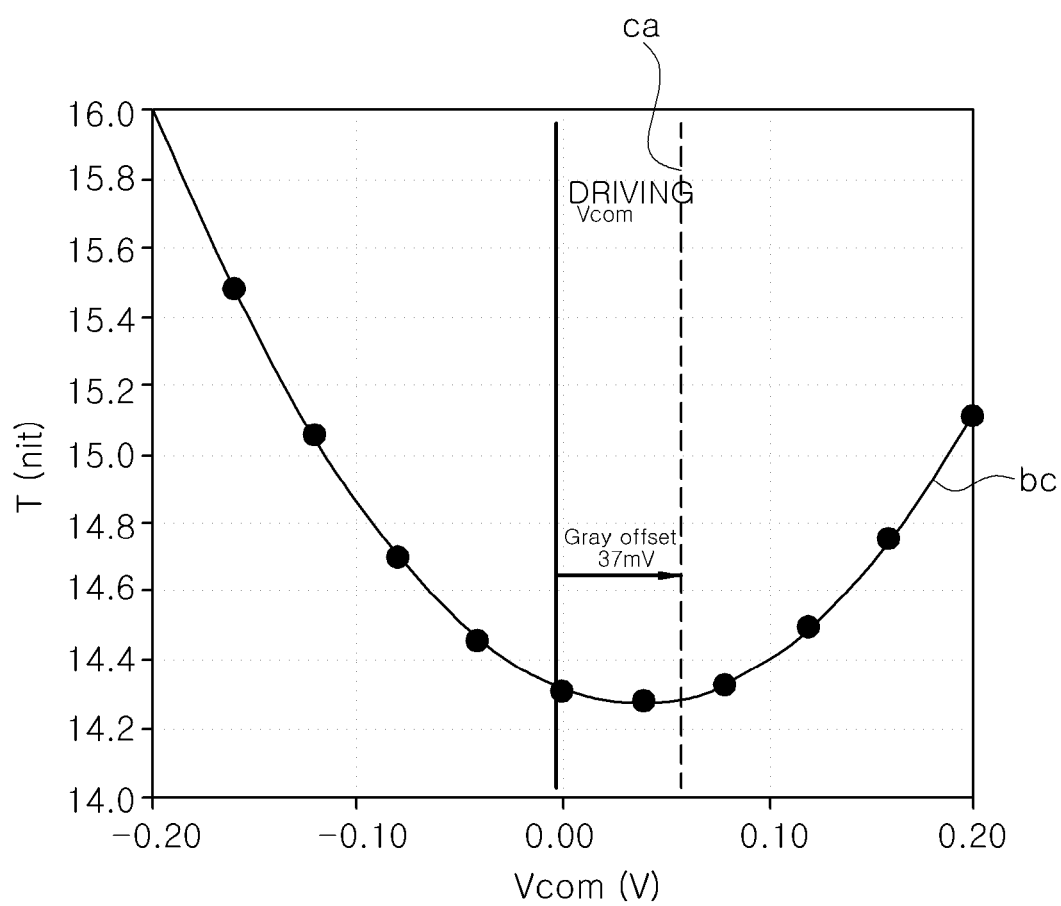

FIGS. 13A and 13B are graphs showing a value of a gray offset based on a thickness of a second layer.

In FIG. 13A, the triple layer protective layer 280 of FIG. 8 is designed such that the thickness of the first layer 280a of FIG. 8 is 3000 Å, the thickness of the second layer 280b of FIG. 8 is 3000 Å, and the thickness of the third layer 280c of FIG. 8 is 200 Å.

As illustrated in the graph, it can be seen that a gray offset of 222 mV occurs. In this case, a brightness difference may be generated due to asymmetry between both polarities which are the positive and negative polarities.

In FIG. 13B, the triple layer protective layer 280 of FIG. 8 is designed such that the thickness of the first layer 280a of FIG. 8 is 4000 Å, the thickness of the second layer 280b of FIG. 8 is 2000 Å, and the thickness of the third layer 280c of FIG. 8 is 200 Å.

As illustrated in the graph, it can be seen that a gray offset of 37 mV occurs, wherein the gray offset is a voltage difference between a driving Vcom and a central axis Ca of a brightness curve bc. In this case, since the gray offset may be minimized compared to the case in which the protective layer 80 of FIG. 2 is formed as the single layer, a brightness difference due to asymmetry between both polarities which are the positive and negative polarities may be prevented.

As described above, it is preferable that the thickness of the second layer 280b of FIG. 8 be less than ½ of the total thickness of the protective layer 280 of FIG. 8, but the thickness of the second layer 280b of FIG. 8 is not limited thereto.

Accordingly, in the second embodiment of the present disclosure, a brightness difference due to the gray offset brought about by the first embodiment may be prevented by forming the protective layer 280 of FIG. 8 as the triple layer and adjusting the thickness of the second layer 280b of FIG. 8 on the basis of the total thickness of the protective layer 280 of FIG. 8.

In a case in which the triple layer protective layer 380 of FIG. 10 is designed such that the thickness of the first layer 380a of FIG. 10 is 4000 Å, the thickness of the second layer 380b of FIG. 10 is 2000 Å, and the thickness of the third layer 380c of FIG. 10 is 200 Å, interfaces of the first layer 380a of FIG. 10 and the second layer 380b of FIG. 10 of the protective layer 380 of FIG. 10 are not deformed. Accordingly, a problem of disconnection between the contact hole 354 of FIG. 10 and the second electrode 370 of FIG. 10 or between the jumping hole 353 of FIG. 10 and the connection pattern 384 of FIG. 10 due to a problem with patterning process characteristics may be solved.

Accordingly, in the third embodiment of the present disclosure, disconnection between the contact hole 354 of FIG. 10 and the second electrode 370 of FIG. 10 or between the jumping hole 353 of FIG. 10 and the connection pattern 384 of FIG. 10 due to a problem with patterning process characteristics of the protective layer 380 of FIG. 10 brought about by in the first embodiment may be prevented by forming the protective layer 380 of FIG. 10 as the triple layer, and adjusting the thickness of the second layer 380b of FIG. 10 on the basis of the total thickness of the protective layer 380 of FIG. 10.

As described above, in the second embodiment, the protective layer 280 of FIG. 8 is formed such that the second layer 280b of FIG. 8 which is the low resistance layer is interposed between the first layer 280a of FIG. 8 and the third layer 280c of FIG. 8 which are the high resistance layers, and in the third embodiment, the protective layer 380 of FIG. 10 is formed such that the second layer 380b of FIG. 10 which is the low resistance layer is interposed between the first layer 380a of FIG. 10 and the third layer 380c of FIG. 10 which are the high resistance layers. Accordingly, since a polarization phenomenon of the interface of the first orientation film 290a of FIG. 8 may be suppressed while a high orientation force is maintained, an afterimage due to the R-DC may be effectively reduced.

In addition, an increase in the gray offset and disconnection between the contact hole 354 of FIG. 10 and the second electrode 370 of FIG. 10 or between the jumping hole 353 of FIG. 10 and the connection pattern 384 of FIG. 10 due to deformation of the interfaces may be prevented by forming the third layer 280c of FIG. 8 or 380c of FIG. 10 which are the high resistance layers.

In this specification, the fringe field mode liquid crystal display device has been described as one example of the present disclosure, but the present disclosure is not limited thereto, and may be applied to liquid crystal display devices having various modes in which a protective layer formed between electrodes is disposed as a multilayer having various resistance values.

In the present disclosure, an afterimage of a liquid crystal display device can be effectively reduced by forming a protective layer between a pixel electrode and a common electrode as a multilayer formed with a high resistance layer and a low resistance layer.

Accordingly, an afterimage can be effectively reduced without a reduction of an orientation force by forming a protective layer as a double layer formed with a high resistance layer and a low resistance layer.

In addition, an increase in a gray offset and disconnection of contact holes (CH) can be prevented by forming a protective layer as a triple layer in which a high resistance layer is further disposed on a low resistance layer.

The above-described embodiments are examples of the present disclosure, and may be freely modified within a range including the spirit of the present disclosure. Therefore, the present disclosure encompasses all appended claims and modifications that fall within a range equivalent to the claims.

What is claimed is:

1. An array substrate comprising:
a first substrate;
a thin film transistor on the first substrate;
a first electrode on the first substrate;
a protective layer on the first electrode; and
a second electrode on the protective layer,
wherein the protective layer includes a first layer and a second layer, the first layer has a first electrical resistivity, the second layer has a second electrical resistivity, the first layer is located between the first electrode and the second layer, and the second electrical resistivity is less than the first electrical resistivity,
wherein the protective layer is disposed between source and drain electrodes of the thin film transistor and the second electrode, and
wherein the protective layer further includes a contact hole configured to expose a common line.

2. The array substrate of claim 1, wherein a thickness of the second layer is less than or equal to a thickness of the first layer.

3. The array substrate of claim 2, further comprising an orientation film configured to cover the second electrode, wherein the orientation film is in contact with the second electrode and the second layer, and the orientation film has an electrical resistivity greater than or equal to the second electrical resistivity.

4. The array substrate of claim 3, wherein the second electrical resistivity is in a range of $\frac{1}{1000}$ to $\frac{1}{10}$ of the first electrical resistivity.

5. The array substrate of claim 4, wherein the first electrical resistivity is $10^{13}$ Ωcm or more.

6. The array substrate of claim 1, wherein the contact hole is configured to connect the second electrode to the common line and the second layer is in contact with the second electrode through the contact hole.

7. The array substrate of claim 6, wherein a gate insulating film is disposed below the first electrode.

8. The array substrate of claim 6, wherein the thin film transistor includes:
a gate electrode on the first substrate;
a gate insulating film on the gate electrode;
a semiconductor layer on the gate insulating film; and
the source electrode and the drain electrode on the semiconductor layer and spaced apart from each other,
wherein the first electrode is disposed below the gate insulating film.

9. The array substrate of claim 6, wherein the contact hole passes through the protective layer and a gate insulating film.

10. The array substrate of claim 1, wherein the protective layer further includes a jumping hole configured to connect the first electrode to the thin film transistor, and the second layer is in contact with the first electrode through a connection pattern disposed on the jumping hole.

11. The array substrate of claim 1, wherein a gate insulating film is disposed below the first electrode, and the first electrode is directly connected to the thin film transistor.

12. The array substrate of claim 10, wherein the thin film transistor includes:
a gate electrode on the first substrate;
a gate insulating film on the gate electrode;
a semiconductor layer on the gate insulating film; and
the source electrode and the drain electrode on the semiconductor layer and spaced apart from each other, and
wherein the first electrode is disposed below the gate insulating film, the connection pattern is formed on the same layer and formed of the same material as the second electrode, and the first electrode is connected to the drain electrode through the connection pattern.

13. The array substrate of claim 12, wherein the jumping hole passes through the protective layer and the gate insulating film.

14. The array substrate of claim 1, wherein the protective layer is located between the second layer and the second electrode and further includes a third layer having a third electrical resistivity, and the third electrical resistivity is greater than the second electrical resistivity.

15. The array substrate of claim 14, wherein the first layer, the second layer and the third layer respectively have a first thickness, a second thickness and a third thickness, and the second thickness is less than or equal to the first thickness and greater than the third thickness.

16. The array substrate of claim 15, wherein the second thickness is less than ½ of a thickness of the protective layer.

17. The array substrate of claim 16, wherein the second thickness is 3000 Å or less.

18. The array substrate of claim 17, further comprising an orientation film configured to cover the second electrode, wherein the orientation film is in contact with the second electrode and the third layer, and the orientation film has an electrical resistivity which is greater than or equal to the second electrical resistivity.

19. A liquid crystal display device comprising:

an array substrate including:

a first substrate;

a thin film transistor on the first substrate;

a first electrode on the first substrate;

a protective layer on the first electrode; and a second electrode on the protective layer, wherein the protective layer includes a first layer and a second layer, the first layer has a first electrical resistivity, the second layer has a second electrical resistivity, the first layer is located between the first electrode and the second layer, and the second electrical resistivity is less than the first electrical resistivity;

a color filter substrate configured to face the array substrate; and a liquid crystal layer disposed between the color filter substrate and the array substrate, wherein the protective layer is disposed between source and drain electrodes of the thin film transistor and the second electrode, and wherein the protective layer further includes a contact hole configured to expose a common line.

20. The array substrate of claim 1, wherein the second electrode is in contact with a side surface of the second layer.

21. The array substrate of claim 1, wherein the thin film transistor includes a plurality of electrodes, and the protective layer entirely overlaps the plurality of electrodes of the thin film transistor.

* * * * *